(12) United States Patent
Koos et al.

(10) Patent No.: US 7,338,908 B1
(45) Date of Patent: Mar. 4, 2008

(54) METHOD FOR FABRICATION OF SEMICONDUCTOR INTERCONNECT STRUCTURE WITH REDUCED CAPACITANCE, LEAKAGE CURRENT, AND IMPROVED BREAKDOWN VOLTAGE

(75) Inventors: Daniel A. Koos, Chandler, AZ (US); Steven T. Mayer, Lake Oswego, OR (US); Heung L. Park, Wilsonville, OR (US); Timothy Patrick Cleary, Portland, OR (US); Thomas Mountsier, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 132 days.

(21) Appl. No.: 10/690,084

(22) Filed: Oct. 20, 2003

(51) Int. Cl.
*H01L 21/302* (2006.01)
(52) U.S. Cl. .................. 438/745; 438/750; 438/751
(58) Field of Classification Search ............. 438/745, 438/750, 751, 754, 641, 678
See application file for complete search history.

(56) References Cited

U.S. PATENT DOCUMENTS

| | | |
|---|---|---|
| 4,002,778 A | 1/1977 | Bellis et al. |
| 4,181,760 A | 1/1980 | Feldstein |
| 4,737,446 A | 4/1988 | Cohen et al. |
| 4,981,725 A | 1/1991 | Nuzzi et al. |
| 5,151,168 A | 9/1992 | Gilton et al. |
| 5,318,803 A | 6/1994 | Bickford et al. |
| 5,380,560 A | 1/1995 | Kaja et al. |
| 5,382,447 A | 1/1995 | Kaja et al. |
| 5,486,234 A | 1/1996 | Contolini et al. |
| 5,576,052 A | 11/1996 | Arledge et al. |
| 5,674,787 A | 10/1997 | Zhao et al. |
| 5,695,810 A | 12/1997 | Dubin et al. |

(Continued)

FOREIGN PATENT DOCUMENTS

JP 03122266 5/1991

(Continued)

OTHER PUBLICATIONS

Mori et al., "Metal Capped Cu Interconnection Technology by Chemical Mechanical Polishing," VMIC Conference, 1996, 487-492.

(Continued)

*Primary Examiner*—Lan Vinh
(74) *Attorney, Agent, or Firm*—Beyer Weaver, LLP

(57) ABSTRACT

An etching process for selectively etching exposed metal surfaces of a substrate and forming a conductive capping layer over the metal surfaces is described. In some embodiments, the etching process involves oxidation of the exposed metal to form a metal oxide that is subsequently removed from the surface of the substrate. The exposed metal may be oxidized by using solutions containing oxidizing agents such as peroxides or by using oxidizing gases such as those containing oxygen or ozone. The metal oxide produced is then removed using suitable metal oxide etching agents such as glycine. The oxidation and etching may occur in the same solution. In other embodiments, the exposed metal is directly etched without forming a metal oxide. Suitable direct metal etching agents include any number of acidic solutions. The process allows for controlled oxidation and/or etching with reduced pitting. After the metal regions are etched and recessed in the substrate surface, a conductive capping layer is formed using electroless deposition over the recessed exposed metal regions.

54 Claims, 3 Drawing Sheets

U.S. PATENT DOCUMENTS

| | | | |
|---|---|---|---|
| 5,770,095 A * | 6/1998 | Sasaki et al. | 216/38 |
| 5,824,599 A | 10/1998 | Schacham-Diamand et al. | |
| 5,891,513 A | 4/1999 | Dubin et al. | |
| 5,897,375 A * | 4/1999 | Watts et al. | 438/693 |
| 5,913,147 A | 6/1999 | Dubin et al. | |
| 5,969,422 A | 10/1999 | Ting et al. | |
| 5,972,192 A | 10/1999 | Dubin et al. | |
| 6,065,424 A | 5/2000 | Shacham-Diamand et al. | |
| 6,136,707 A | 10/2000 | Cohen | |
| 6,174,353 B1 | 1/2001 | Yuan et al. | |
| 6,184,124 B1 * | 2/2001 | Hasegawa et al. | 438/625 |
| 6,197,181 B1 | 3/2001 | Chen | |
| 6,197,364 B1 | 3/2001 | Paunovic et al. | |
| 6,329,284 B2 * | 12/2001 | Maekawa | 438/637 |
| 6,342,733 B1 | 1/2002 | Hu et al. | |
| 6,355,153 B1 * | 3/2002 | Uzoh et al. | 205/87 |
| 6,398,855 B1 | 6/2002 | Palmans et al. | |
| 6,645,567 B2 | 11/2003 | Chebiam et al. | |
| 6,692,546 B2 * | 2/2004 | Ma et al. | 51/298 |
| 6,692,873 B1 | 2/2004 | Park | |
| 6,716,753 B1 * | 4/2004 | Shue et al. | 438/687 |
| 6,884,724 B2 | 4/2005 | Hsu et al. | |
| 6,887,776 B2 | 5/2005 | Shang et al. | |
| 6,975,032 B2 | 12/2005 | Chen et al. | |
| 7,008,871 B2 | 3/2006 | Andricacos et al. | |
| 7,049,234 B2 | 5/2006 | Cheng et al. | |
| 7,056,648 B2 | 6/2006 | Cooper et al. | |
| 2001/0038448 A1 * | 11/2001 | Jun et al. | 356/237.4 |
| 2002/0084529 A1 | 7/2002 | Dubin et al. | |
| 2003/0003711 A1 * | 1/2003 | Modak | 438/629 |
| 2003/0059526 A1 | 3/2003 | Benson et al. | |
| 2003/0059538 A1 | 3/2003 | Chung et al. | |
| 2003/0075808 A1 | 4/2003 | Inoue et al. | |
| 2003/0176049 A1 | 9/2003 | Hegde et al. | |
| 2003/0190426 A1 | 10/2003 | Padhi et al. | |
| 2004/0065540 A1 | 11/2003 | Chebiam et al. | |
| 2004/0253740 A1 | 12/2004 | Shalyt et al. | |
| 2005/0074967 A1 * | 4/2005 | Kondo et al. | 438/630 |
| 2005/0158985 A1 | 7/2005 | Chen et al. | |
| 2005/0266265 A1 | 12/2005 | Cheng et al. | |
| 2006/0205204 A1 | 9/2006 | Beck | |

FOREIGN PATENT DOCUMENTS

| | | |
|---|---|---|
| WO | 99/47731 | 9/1999 |

OTHER PUBLICATIONS

Hu et al., "Reduced Electromigration of Cu Wires by Surface Coating," Applied Physics Letters, vol. 81, No. 10, (2002), 1782-1784.

E.G. Colgan, "Selective CVD-W for Capping Damascene Cu Lines," Thin Solid Films, 262, (1995), 120-123.

Enhanced Copper Metallurgy for BEOL Application, IBM Technical Disclosure Bulletin, vol. 33, No. 5, (1990), 217-218.

Sullivan et al, Electrolessly Deposited Diffusion Barriers For Microelectronics, E. J. IBM J Res Develop vol. 42, No. 4 Sep. 1998, 607-620.

Eugene J. O'Sullivan, "Electroless Deposition in Microelectronics: New Trend," Electrochemical Society Proceeding vol. 99-34, 159-171, no dates available.

T. Itabashi et al., "Electroless Deposited CoWB for Copper Diffusion Barrier Metals," Hitachi Research Laboratory, IEEE, 2002, 285-287.

N. Petrov and Y. Shacham-Diamand, "Electrochemical Study of the Electroless Deposition of Co(W,P) Barrier Layers for Cu Metallization," Electrochemical Soc. Proceedings vol. 2000-27, 134-148, no date available.

Yosi Shacham-Diamand and Sergey Lopatin, "Integrated Electroless Metallization for ULSI," Electrochimica Acta, (44 (1999) 3639-3649.

Theoretical Studies on the Electroless Metal Deposition Reaction Mechanism Group, printed from website http://www.appchem.waseda.ac.jp on Jul. 3, 2002. Published prior to the filing of this application. 3 Pages.

Wolf, Silicon Processing for the VLSI Era, Lattice Press, vol. 3, p. 648, 1986.

U.S. Office Action mailed Jan. 23, 2007, from U.S. Appl. No. 11/251,353.

Andryuschenko et al., "Electroless and Electrolytic Seed Repair Effects on Damascene Feature Fill," Proceedings of International Interconnect Tech. Conf., San Francisco Ca., Jun. 4-6, 2001, pp. 33-35.

Chen et al., "ECD Seed Layer for Inlaid Copper Metallisation," Semiconductor Fabtech —12$^{th}$ Edition, 5 Pages, Jul. 2000.

Ken M. Takahashi,. "Electroplating Copper into Resistive Barrier Films," Journal of the Electrochemical Society, 147 (4) 1417-1417 (2000).

T.P. Moffat et al., "Superconformal Electrodeposition of Copper in 500-90 nm Features," Journal of the Electrochemical Society, 147 (12) 4524-4535 (2000).

Ritzdorf et al., "Electrochemically Deposited Copper," Conference Proceedings ULSI XV 2000, Materials Research Society, 101-107.

Reid et al., "Optimization of Damascene Feature Fill for Copper Electroplating Process," Shipley Company, IITC 1999, 3 Pages.

Reid et al., "Copper PVD and Electroplating," Solid State Technology, Jul. 2000, www.solid-state.com, 86-103.

Reid et al., "Factors Influencing Fill of IC Features Using Electroplated Copper," Adv Met Conf Proc 1999, MRS 10 Pages, (2000).

Shacham-Diamond et al., "Copper Electroless Deposition Technology for Ultr-Large-Scale-Integration (ULSI) Metallization," Microelectronic Engineering 33 (1997) 47-58.

Hu et al., "Effects of Overlayers on Electromigration Reliability Improvement for Cu/Low K Interconnects," Presented in the Proceedings of the 42$^{nd}$ Annual IRPS held Apr. 25-29, 2004, p. v, article published May 28, 2004, 7 Pages.

Park et al., "Electroless Layer Plating Process and Apparatus", Novellus Systems, Inc., U.S. Appl. No. 10/235,420, filed Sep. 30, 2002.

U.S. Office Action dated Sep. 1, 2005 for U.S. Appl. No. 10/235,420.

Mayer et al., "Pad-Assisted Electropolishing," Novellus Systems, Inc., U.S. Appl. No.: 11/213,190, filed Aug. 26, 2005. [NVLS-3037].

Mayer et al., "Topography Reduction and Control by Selective Accelerator Removal," Novellus Systems, Inc., U.S. Appl. No.: 11/602,128, filed Nov. 20, 2006. [NVLS-2960].

Aksu et al., "The Role of Glycine in the Chemical Mechanical Planarization of Copper," Journal of The Electrochemical Society, 149 (6) G 352-G361 (200), Department of Materials Science and Engineering, University of California, Berkeley, Berkeley, California 94720-1760, USA.

U.S. Office Action mailed Aug. 16, 2006 from U.S. Appl. No. 10/742,006. [NOVLP065/NVLS-2796].

Office Action mailed Jul. 27, 2007, from U.S. Appl. No. 11/586,394 [NOVLP068X1/NVLS-2818C1].

U.S. Final Office Action mailed Jul. 18, 2007 from U.S. Appl. No. 11/251,353. [NOVLP141/NVLS-3107].

SanderKok.com, "Analytical Chemistry", http//home.planet.nl/-skok/ttechniques/laboratory/pka_pkb.htm.

\* cited by examiner

METHOD FOR FABRICATION OF SEMICONDUCTOR INTERCONNECT STRUCTURE WITH REDUCED CAPACITANCE, LEAKAGE CURRENT, AND IMPROVED BREAKDOWN VOLTAGE

CROSS REFERENCE TO RELATED PATENT APPLICATION

This application is related to U.S. application Ser. No. 10/317,373, filed on Dec. 10, 2002, entitled "Nitridation Of Electrolessly Deposited Cobalt," by Heung L. Park now U.S. Pat. No. 6,962,873, which is incorporated herein by reference in its entirety for all purposes.

FIELD OF THE INVENTION

This invention pertains to methods for producing an effective capping layer for metal lines in integrated circuits. More particularly, the invention pertains to methods of selectively etching metal lines and/or vias before depositing a conductive capping layer over the metal surfaces.

BACKGROUND

The dielectric breakdown voltage current associated with metal interconnect structures is determined by the intrinsic properties of the dielectric material interspersed between the metal lines as well as extrinsic properties such as the distance between the metal lines.

As device feature sizes continue to shrink and the distance between the metals lines is reduced, it is important to control the spacing between the lines. This means close attention to patterning of the structures, the deposition of the metal, planarization of the structure and any subsequent processing. One must avoid any encroachment between adjacent lines during processing in order to preserve good electrical characteristics of the structure.

Current technology uses an inlaid metal structure where the metal lines are formed by depositing a dielectric, pattern transfer and etching of lines in the dielectric, and subsequently depositing metals into the trenches by various means. A conformal copper barrier, such as Ta or TaN is typically deposited over the entire surface by a PEVCD (plasma Enhanced Chemical Vapor Deposition) process. Typically, a copper seed layer is deposited on top of this copper barrier layer. The recesses in the structure are then filled by a "bottom-up" non-conformal plating operation. Additional copper metal (an "overburden" of a thickness typically equal to slightly more than the thickness of the dielectric layer) is plated so that large, low aspect ratio features (those not filled by the non-conformal process) are filled with metal up to the plane of the dielectric. The overburden of the metal deposition may be removed by chemical mechanical polishing (CMP), and the individual lines and vias are thereby isolated. This is a general description of the so-called "damascene" process flow.

The space between adjacent lines is determined by various features including (1) patterning and etching of the trenches into which the metal is deposited, (2) the resulting etch profile, and (3) the depth to which the metals and dielectric are polished during CMP. Note that CMP depth affects lines spacing only if the features are not completely vertical. The typical sought-after result is to have all surface topography removed and a planar surface between the metal and dielectric surfaces.

Following this planarization process, a layer of silicon nitride is deposited to encapsulate the layers and serve as a barrier to metal (primarily copper) diffusion and an etch stop for subsequent layers. Because this layer has a relatively higher dielectric constant than the surrounding low-k dielectric layer, it can add significantly to the overall capacitance experienced by the lines and interconnects, thereby having a negative impact on performance. A more recent process, which selectively deposits a metallic "capping" layer, is superior because of a reduction in line resistance. It also limits the deleterious effects of device electromigration (EM), which results from defect sites at the metal/dielectric interface.

The conductive capping layer can be deposited on the metal lines prior to the encapsulating dielectric by a spatially selective method, such as electroless plating or selective CVD. These methods are typically isotropic in nature and result in lateral as well as vertical growth of the newly deposited film. Thus, the resulting conductive capping layer may laterally spread over the dielectric layer causing adjacent metal lines to encroach one another. This gives rise to a deleterious effect on the leakage and breakdown voltage of the device.

A typical capping layer process includes the following process operations: dielectric deposition, etch to form trenches and vias, conductive barrier deposition, metal deposition, planarization, selective conductive cap deposition, dielectric barrier deposition (optional), and dielectric deposition.

The lateral growth of the capping layer reduces the effective space between the metal lines, reducing the extrinsic insulating property of the interspersed dielectric and resulting in an increase in the electric field between the metal lines. What is therefore needed is a capping method that solves the problems of low breakdown voltages and high line leakage typically encountered with conductive barrier capper layers.

SUMMARY

The present invention addresses the problems identified above by providing methods to create a capping layer which provides for an interconnect structure with reduced capacitance, leakage current, and improved breakdown voltage. It accomplishes this by etching metal from the exposed metal regions of the substrate to a position below the level of the exposed dielectric and forming a capping layer on the etched metal portions of the substrate using electroless deposition techniques. In other embodiments, the capping layer is deposited by non-electroless techniques such as PVD followed by planarization, selective CVD, and selective deposition from a supercritical solution.

In some embodiments, the exposed metal of the substrate is copper or a copper alloy, such as exposed copper lines or vias in Damascene processes. Any number of suitable metal-containing capping layer materials can be used. In preferred embodiments, the capping layer comprises a refractory metal such as cobalt or an alloy of cobalt. The exposed metal of the substrate is preferably etched to a position below the level of the exposed dielectric that is approximately equal to or lower than the target thickness of the capping layer. The capping layer is then deposited to approximately the target thickness, which is chosen such that it is thick enough to act as a diffusion barrier but not too thick as to unnecessarily increase the resistance between conductive paths on adjacent metallization layers.

The etching can be performed in any suitable manner. In some embodiments, the exposed metal is contacted with an etching solution that oxidizes a portion of the exposed metal to a metal oxide. The metal oxide metal is then removed from the surface of the substrate using a metal oxide etching agent. In other embodiments, the exposed metal is contacted with an etching solution that directly etches the exposed metal without producing an insoluble metal oxide. In yet other embodiments, the exposed metal is contacted with an oxidizing gas to produce a metal oxide and the metal oxide is then removed from the surface of the substrate using a metal oxide etching agent. An optional annealing process can be used to pretreat the exposed metal surface before etching.

In embodiments in which the exposed metal is contacted with an oxidizing etching solution, exemplary oxidizing agents include, but are not limited to, peroxides, permanganates, persulfates, and ozone solutions, preferably at a pH of at least about 5. In addition to the oxidizing agent, the etching solution may contain a corrosion inhibitor to minimize grain attacks and surface roughening of the exposed metal. Alternatively, the exposed metal may be treated with corrosion inhibitor prior etching. In addition to the oxidizing agent, the etching solution may contain a complexing agent to control the etching rate and/or a surfactant to further modulate the etch rate.

Once metal oxides are formed on the surface of the substrate, they can be removed by using any suitable technique. In some embodiments, the metal oxide is removed by using an oxide etching agent such as glycine, although any of a number of copper complexing agents may be used. In some cases, metal oxide formation and removal take place in a single solution.

In embodiments in which the exposed metal is contacted with a direct etchant and no metal oxide is formed, the etching solution may be a relatively high pH solution (e.g., a solution of tetramethyl ammonium hydroxide, ethanol amine, ammonium hydroxide and the like). In addition, the direct etching solution may contain a corrosion inhibitor, a complexing agent and/or a surfactant to further modulate the etch rate.

Any number of suitable techniques may be used to contact the substrate surface and exposed metal with the etching solution. These techniques can include, but are not limited to, dipping, spraying or using a thin film reactor.

As indicated, the etching may comprise contacting the substrate with an oxidizing gas that oxidizes the exposed metal to a metal oxide and then transferring the substrate to an aqueous solution containing a metal oxide etching agent to remove the metal oxide. The gas oxidation occurs in a suitable reaction chamber. If the oxidizing gas is oxygen, preferred temperatures are between about 200 and 300 degrees Celsius and preferable oxygen pressure is between about 50 and 180 Torr.

After the metal portions of the substrate are etched to provide newly exposed recessed metal portions of the substrate, a post-etch treatment may optionally be performed prior to forming the capping layer. In general, post-etch treatments are used to promote better adhesion of the deposited capping layer. Post-etch treatments can include those which clean the newly exposed metal surface to remove remaining metal oxides or other contaminants.

After the post-etch treatment, if implemented, a conductive capping layer is formed over the etched metal portions of the substrate using electroless deposition or other suitable technique. In some embodiments, the capping layer is formed using a two-phase method, which involves first forming a metal nucleation layer on the etched metal portions of the substrate and then forming a bulk metal layer on the metal nucleation layer. In the first phase, the metal nucleation layer is formed by using an electroless deposition solution containing metal ions (e.g., cobalt ions) and a compound (e.g., water-soluble borane compound) that assists in nucleation of cobalt on a non-cobalt surface. In the second phase, a bulk metal layer is formed using a different electroless deposition solution containing metal ions and a compound (e.g., a hypophosphite reducing agent) that facilitates autocatalytic deposition of cobalt.

The process may also include a post-deposition anneal process which, under certain circumstances, allows for at least partial mixing of dopants within the metal nucleation and bulk metal films. In other embodiments, the process also allows for the optional formation of a cobalt nitride film to further enhance the barrier properties of the cobalt capping layer. In these embodiments, the process further includes a nitriding operation to create a metal nitride layer on the bulk metal layer.

These and other features and advantages of the invention will be described in more detail below, with reference to the associated drawings.

DETAILED DESCRIPTION OF A PREFERRED EMBODIMENT

Introduction

As indicated, the present invention provides methods for selectively etching exposed metal from a substrate and forming a conductive capping layer on the etched exposed metal. The invention can be used to address problems associated with traditional methods of forming a capping layer such as interconnect line encroachment which can lead to current leakages within the interconnect and voltage breakdown of the device. Reference will be made to specific embodiments in accordance with the present invention. For instance, electroless deposition of cobalt capping layers will be used as a principal example. While the invention will be described in conjunction with these specific embodiments, it will be understood that it is not intended to limit the invention to any particular embodiment. A sampling of other deposition techniques and other capping layer materials will be provided below.

Figure 1A:
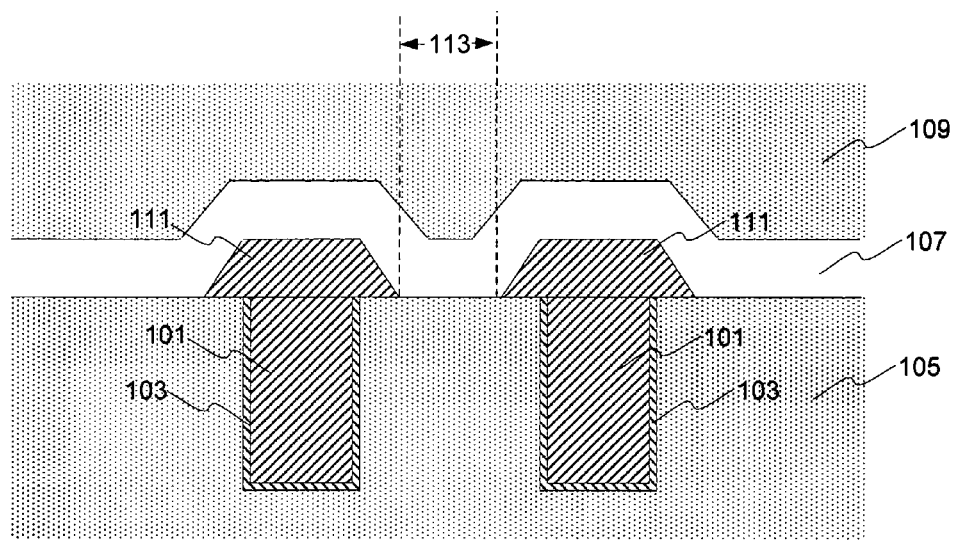
FIG. 1A is a schematic illustration of cross section of a portion of a Damascene structure with capping layers formed by using traditional methods.

FIG. 1A depicts a cross sectional view of a Damascene device using conventional methods for forming capping layers. Metal lines 101 are encapsulated with conductive barrier material 103 and surrounded by dielectric 105 such as silicon dioxide or a low-k material such as a porous silicon oxide and/or carbon containing silicon oxide. To prevent the occurrence of electromigration and to complete the encapsulation, capping layers 111 are selectively deposited over the metal lines 101. In some cases, a dielectric barrier layer 107 (e.g., silicon nitride) is additionally deposited over the surface of the wafer on the capping layers 111. A second dielectric 109 of similar composition to dielectric 105 is then deposited over the dielectric barrier layer 107. Subsequently, vias are etched through dielectric layers 107 and 109 to provide interconnects for a next metallization layer.

As shown in FIG. 1A, the portions of the capping layers 111 extending over the top of dielectric layer 105 spread on either side of the metal lines 101 and taper to the same width as the metal lines 101 at the top of the capping layers 111. This mushroom shape is a result of using traditional electroless plating methods. These traditional methods deposit material in an isotropic fashion—that is they deposit material in a lateral as well as a vertical direction. The lateral growth of the capping layer reduces the distance 113 between the metal lines 101, thereby increasing in the electric field between the metal lines 101.

The present invention addresses this problem by incorporating process operations that alter the Damascene structure prior to depositing a capping layer. Specifically, methods of the invention can be used for selectively etching exposed portions of metal lines, creating recessed regions of the surface of the substrate where the metal lines exist, followed by selectively forming the capping layer on the recessed metal regions. This process provides a structure in which the distances between the conductive capping layers are substantially the same as the distances between the metal lines and wherein the surface of the substrate is substantially horizontally planar. In other words, the mushroom structures of FIG. 1A are replaced with the columnar structures of FIG. 1B.

Figure 1B:
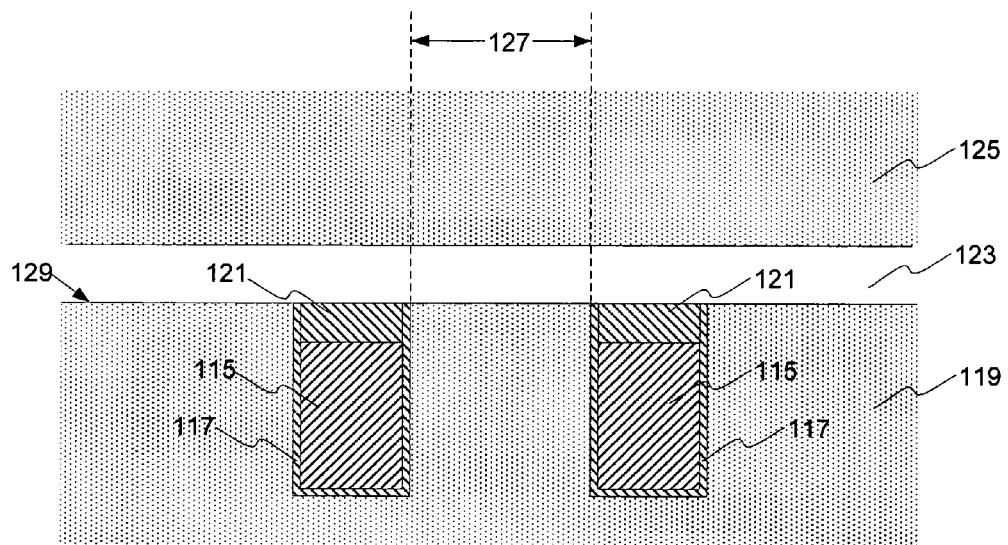
FIG. 1B is a schematic illustration of a cross section of a portion of a Damascene structure with capping layers formed by using methods in accordance with the invention.

For example, FIG. 1B depicts a cross sectional view of a Damascene device with a capping layer produced using methods of the present invention. Metal lines 115 are encapsulated with conductive barrier material 117 and surrounded by dielectric 119. To prevent the occurrence of electromigration and to complete encapsulation, capping layers 121 are selectively deposited over the metal lines 115. As indicated above, a dielectric barrier layer 123 may additionally be deposited over the surface of the wafer on the capping layers 115. A second bulk dielectric 125 is then deposited over the dielectric barrier layer 123.

As shown in FIG. 1B, the capping layers 121 are of about the same width as the metal lines 115. In addition, the top portions of the metal lines 115 are recessed below the level of the top of the surrounding dielectric 119, thereby providing space for the capping layers 121 to be deposited and resulting in a horizontally planar surface 129 at the interface with the dielectric barrier layer 123. Compared to the methods to form the structure of FIG. 1A, methods used to form the structure of FIG. 1B avoid encroachment of the conductive capping layers into the interspersed dielectric, thereby providing more robust insulation of the conductive regions of the interconnect structure and less electric field interaction between metal lines.

Example Process Flow

A detailed process flow to provide the improved interconnect structure described above will now be described. Note that this process flow is an exemplary embodiment and does not encompass the full range of possible embodiments in accordance with the invention. For example, in the processes described below for formation of the capping layer, a detailed description for the deposition of a cobalt-containing capping layer is described. It should be understood that the processes might also be applied to the formation of other conductive capping layers such as those that include palladium, ruthenium, platinum, tungsten, lead, cadmium, tantalum, tantalum nitride, nickel, titanium, titanium nitride, molybdenum, and combinations and alloys thereof. Some of these materials may be combined with relatively small amounts (up to about 10% by weight) of non-metallic compounds such as boron, phosphorus, carbon, silicon, nitrogen, and sulfur. In each case, the material should act as a barrier to the diffusion of copper.

Further, the invention extends to non-electroless deposition processes such as (a) physical vapor deposition (PVD) followed by chemical mechanical polishing or other planarization technique, (b) selective chemical vapor deposition (CVD) on the etched metal regions, (c) atomic layer deposition (ALD), (d) selective reduction of an organometallic precursor from a supercritical solution including carbon dioxide for example, and the like.

In preferred embodiments of the invention, the substrate is a semiconductor wafer containing partially fabricated integrated circuitry. In the embodiments described below, methods for selectively forming capping layers on exposed copper surfaces surrounded by dielectric material will be disclosed. Such methods are useful in Damascene structures, for example, wherein capping layers are formed on copper lines and/or vias. It should be noted, however, that methods of the invention might be implemented on any metal surface. For example, the metal surface may contain aluminum, tungsten, molybdenum or alloys thereof, as well as alloys of copper.

Figure 2:
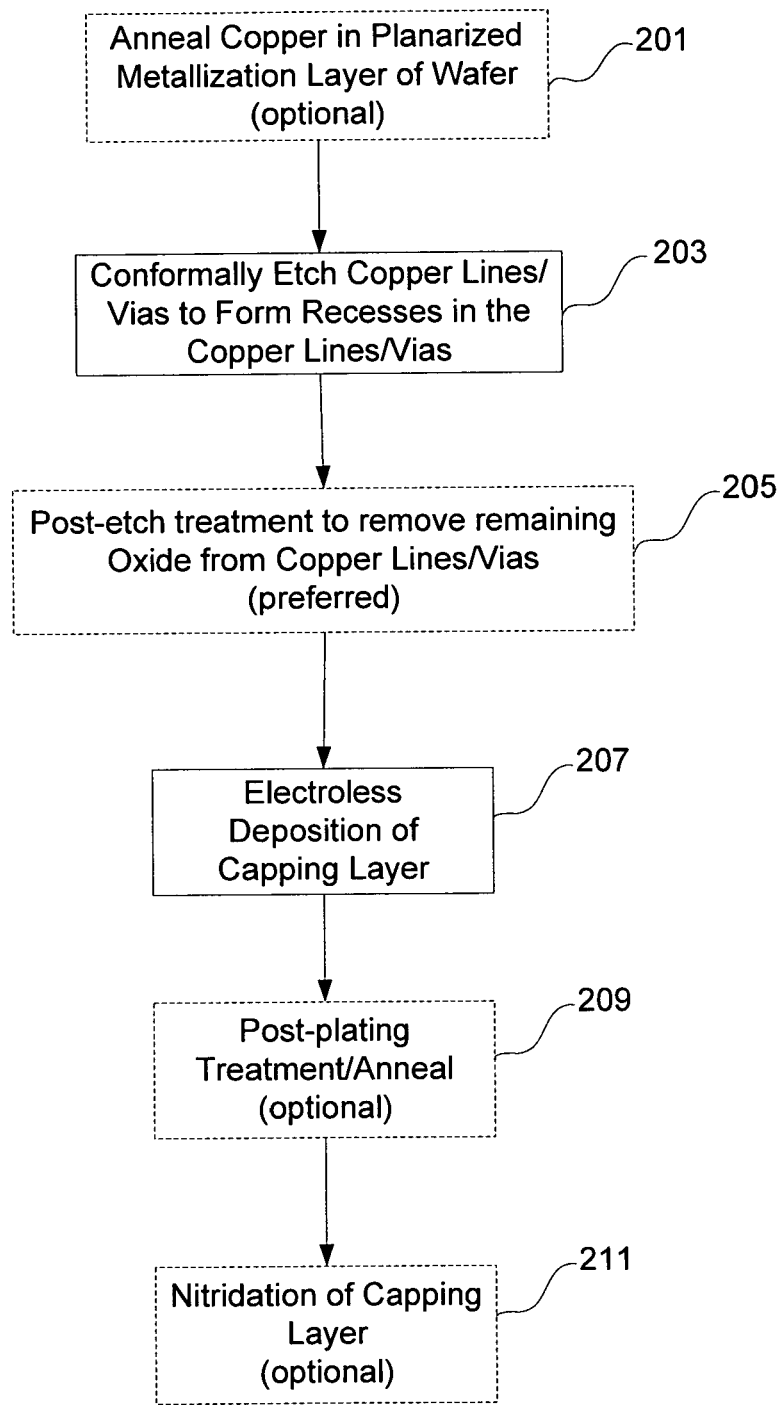
FIG. 2 is a flowchart summarizing a procedure for selectively etching a metal surface of an integrated circuit and depositing a capping layer over the metal in accordance with one embodiment of the present invention.

A typical process flow for the formation of a capping layer in accordance with this invention is illustrated in the flowchart of FIG. 2. Typically, though not necessarily, the process begins with a planarized surface of the substrate. Any suitable planarization technique, such as CMP or electroplanarization, may be used. In many cases, planarization will proceed to a point where all metal has been removed between the interconnecting lines (i.e. at a point where all the lines are electrically isolated). However, the process can also begin with a surface that has not been planarized or has been partially planarized to remove residual topography but not to the point of exposing the underlying dielectric. In this case the etchant initially removes the metal from the field area and above the lines at essentially the same rate as that over the metal until all of the copper is removed from over the field. Then the operation proceeds as in the general sequence now described.

The first operation on the planarized and cleared substrate is an optional pre-treatment of the substrate as indicated at 201. One example of such pretreatment is an anneal, i.e., a thermal process that changes the morphology of the copper and helps stabilize the crystal structure of the copper. This process serves to prevent the copper from experiencing significant mechanical stress in subsequent IC thermal processes. Preferable wafer temperatures of thermal anneal processes are between about 150 and 400 degrees Celsius. Temperatures in the higher end of this range are generally preferred, but may be unattainable for some dielectric materials that are not able to handle thermal stress. The anneal time may range between about 20 seconds and 2 hours, with longer times being required for lower temperatures. In one example, the anneal is performed in an inert atmosphere such as a forming gas ($N_2/H_2$) or under vacuum. In the case of forming gas anneals, a specific gas composition of about 97% $N_2$ and about 3% $H_2$ is used. The gas flow may be about 100 L/min dependent on the size of the chamber. In the case of vacuum anneals the vacuum may be held at about $10^{-3}$ to $10^{-5}$ Torr.

Referring back to FIG. 2, once the appropriately pretreated substrate is provided, the surfaces of the copper lines and/or vias are selectively etched (versus the dielectric and preferably both the barrier lining and the dielectric) to form recessed copper surfaces where the lines and/or vias exist. This is achieved by selectively etching the exposed surfaces of the copper. See process block 203. The amount of metal etched is preferably equal to or greater than the target thickness of the conductive capping layer that will be deposited.

Note that if the method begins with a substrate in which the dielectric field regions are not already exposed, the etching operation may proceed through the overlying copper (overburden) to expose the top of the dielectric layer and then continue from there a short distance below the newly exposed field region of the dielectric. Note that this may be appropriate in a situation where a planarization technique other than CMP is used (e.g., an electroplanarization technique) or where planarization is only partially completed.

Any suitable methods for etching the exposed metal of the substrate may be may be employed to remove a portion of the exposed metal from the surface of the substrate to produce a new exposed metal surface at a position below the level of the dielectric and to provide space for a subsequently deposited capping layer. Methods that selectively etch metal surfaces and do not substantially etch the surrounding dielectric are employed. Issues surrounding etching are described in U.S. Pat. No. 5,486,234 issued Jan. 23, 1996 to Contolini, Mayer, and Tarte, which is incorporated herein by reference for all purposes.

It should be noted that this etch process, in addition to providing space for the capping layer, can provide additional benefits toward the integrity of the interconnect structure. In particular, after an etch process, the newly exposed copper surface is typically slightly rougher than the original copper surface due the nature of etching processes, thereby potentially providing better adhesion of the capping layer to the copper. Processes for etching the metal, however, should not roughen the metal surface so much as to create pits or cavities deep enough to retain pockets of moisture during subsequent process operations.

Three general methods of selectively etching the exposed copper will now be described. Two of the methods involve a two-part process in which a copper oxide is formed followed by removal of the copper oxide from the surface of the substrate—one in which the copper oxide is formed using a wet chemical solution and one in which the copper oxide is formed using an oxidizing gas. The third method involves directly etching and removing the copper from the substrate surface in one step. Note that different etch techniques may produce different topologies on the metal surface. For example, methods that directly etch copper often result in a rougher metal surface compared to methods that form a copper oxide intermediate. Further, methods that form an oxide tend to etch uniformly across the metal surface in a feature and are essentially independent of feature size. This is because the oxidation reaction is generally not diffusion controlled, but is instead controlled by surface kinetics.

Any number of suitable techniques may be used to contact the substrate surface and exposed metal with the etching solution. These techniques can include, but are not limited to, immersing, spraying, spin on contact, and the like. In one example, apparatus for applying etching solution include those used for many EBR (edge bevel removal) or SRD (spin rinse drier) applications. An example of a suitable apparatus and methods for its use are described further in U.S. Pat. No. 6,309,981 and in U.S. Pat. No. 6,586,342 issued Jul. 1, 2003 to Mayer et al., both of which are incorporated herein by reference for all purposes. In a preferred approach, the etching solution is sprayed onto a rotating substrate that is rotated between about 20-200 rpm at ambient temperatures.

As indicated, one method involves indirectly etching by exposing the underlying metal to an etching solution that oxidizes a portion of the metal to a metal oxide (e.g., copper oxide), followed by removal of the metal oxide from the surface of the substrate using a metal oxide etching agent. Any suitable oxidizing agent capable of forming copper oxide may be used, however, it is generally preferred that a self-limiting oxidation process be used. That is, the oxidation of the copper occurs slowly and controllably. Exemplary oxidizing agents include, for example, dilute aqueous solutions of peroxides (such as hydrogen peroxide), persulfates, ozone and/or permanganates. In some embodiments, the oxidizing solution has a relatively high pH, e.g., at least about 5. In more specific cases, the solution has a pH of between about 5 and 12, and in even more specific cases, between about 6 and 10. To control the oxidizing solution pH, a buffering agent may be used, preferably one with an anion that does not complex with copper ions. Examples include tetra-alkyl ammonium and alkali metal salts of hydroxides. The oxidizing etch solution may also contain a complexing agent that complexes with the copper to control the etching rate of the acid, and/or a surfactant to further modulate the etch rate.

Generally, the copper oxidation process takes place uniformly over the features of the partially fabricated IC. Thus, the etching is independent of feature size, feature separation, position within a feature, etc. Again, this is because the oxidation rate is controlled primarily by surface reaction kinetics, as opposed to diffusion of compounds to and/or from the copper surface.

Once copper oxide is formed by the oxidizing solution, it can be removed by using any suitable copper oxide etchant. In some embodiments the copper oxide etchant selectively removes copper oxide without substantially attacking the copper crystallites or grain boundaries. Suitable copper oxide etchants include dilute acids, glycine and various copper complexing agents, for example. Exemplary acids include dissociated inorganic acids such as phosphoric acid, sulfuric acid and organic acids such as acetic acid. Appropriate pH for the etching solution is typically in the range of about 0 and 2. Suitable complexing agents may include ethylenediamine tetraacetic acid (EDTA), citric acid and salts thereof, maleic acid and salts thereof, and certain ammonium compounds known to those of skill in the art, for example.

In some embodiments, separate oxidizing and oxide etching solutions are employed. In other embodiments, a single solution is used for both oxidizing copper and removing copper oxide. By controlling the ratio of copper oxidizing agent and copper oxide etchant in such solutions, one can control the amount of oxidation and depth of the intermediate copper oxide film that is formed on the surface of the substrate. In a preferred embodiment, the solution includes between about 0.05% and 15% glycine (or copper complexing agent) by weight and between about 0.5% and 20% peroxide (e.g., $H_2O_2$) by weight. In a specific embodiment, for example, an etching solution containing about 1% (by weight) glycine and about 3% (by weight) $H_2O_2$ is used.

Preferably, the single solution includes a buffering agent that maintains the pH at a specific value. Buffering agents such as acetate, carbonate, or phosphate can be selected depending on the desired pH value. More specifically, the solution may have a pH of between about 5 and 12, and in even more specific cases, between about 6 and 10. The pH can be adjusted by the addition of an appropriate agent such as an alkali metal or tetra-alkyl ammonium hydroxide.

The etching and/or oxidizing solution may additionally contain a corrosion inhibitor to minimize grain attacks and surface roughening of the exposed copper metal. Suitable corrosion inhibitors include, but are not limited to, benotriazole (BTA), thiourea, certain mercaptans, and imidazoles. Note that in addition to or instead of adding corrosion inhibitor to the etching solution, the substrate surface may be treated with a solution containing corrosion inhibitor prior to etching.

It should be noted that there exists a family of metal "polishing" solutions such as those used in metal CMP processes or mirror polishing processes that may be used in some embodiments of the present invention. These polishing solutions form an oxide and immediately etch it off the substrate. They are sometimes slurries that are sufficiently viscous to retard the transport of intermediate copper oxides (or other intermediate species) away from the substrate, thereby slowing down the formation of more intermediate copper oxides and etching away of these intermediate copper oxides. These methods provide very controlled etching so that smooth metal surfaces will result. As one example, the "polishing" solution may include ammonium cerium nitrate with nitric acid. Another example comprises inorganic substantially anhydrous acids with small amounts (e.g., about 0.2 to 5%/wt) of oxidizers (e.g., 85%+/wt phosphoric acid in water together with hydrogen peroxide or sulfuric acid with ozone). Yet another example comprises organic acids with small amounts of oxidizers (e.g., glacial acetic acid with about 1 to 5%/wt of permanganate).

A second etching method involves exposing the copper to an etching solution that directly etches the exposed copper and removes the copper metal from the substrate without producing an intermediate copper oxide. Chemicals that directly etch copper tend to preferentially etch at grain boundaries of the copper and roughening the copper surface. As described previously, to some extent roughening of the copper surface may help to promote adhesion of the capping layer but too much roughening of the copper surface can result in the development of pockets of moisture that can form copper oxide after the capping layer is deposited and deteriorate the copper interconnect structure. Therefore, in preferred embodiments, the direct etch solution preferably provides a controlled, non-aggressive etch. The etching can be controlled for example by controlling the pH of the solution (acidic solutions tend to etch more quickly) and/or by including complexing agents to the etching solution that complex with the copper.

In one embodiment, a direct etch is accomplished using a relatively high pH solution such as a solution of TMAH (tetra methyl ammonium hydroxide), ammonium hydroxide, ethanolamine, and the like. In other embodiments, the direct etching solution has a weakly acidic composition including, for example, citric acid, dilute sulfuric acid, etc., together with one or more additives that control etch rate. Examples of such additives include, but are not limited to, corrosion inhibitors such as benzotriazole and thiourea. Note that the etch rate can progress very rapidly in acidic solutions because the reaction products are generally soluble and do not limit the reaction rate. The etching solution may also contain a complexing agent, corrosion inhibitor and/or surfactant to further modulate the etch rate. Suitable complexing agents, corrosion inhibitors and surfactants may include those mentioned previously as well for indirect etching solutions. Any of a number of direct etching solutions may be used. A list of appropriate direct metal etching solutions can be found in "The Handbook of Metal Etchants", CRC Handbook of Etchants for Metals and Metallic Compounds by Perrin Walker, William H. Tam, Susan C. Smolinske, Emma Previato (Contributor), Elena Marchisotto (Contributor).

A third etching method involves exposing the copper to an oxidizing gas to produce a copper oxide, followed by transferring the substrate to a solution containing a copper oxide etching agent to remove the copper oxide. One of the advantages of using a gas oxidation process is that the amount of oxidation (i.e. depth of the copper oxide film) can be directly controlled by temperature of the reaction. The gas oxidation occurs in any of a number of suitable reaction chambers such as a conventional CVD or plasma etch reactor. Any suitable oxidizing gas that can chemically react in a self-limiting fashion with the copper to form a passivating film on the copper surface may be used. If the oxidizing gas is oxygen, preferable temperatures are between about 200 and 300 degrees Celsius and preferable oxygen pressure is between about 50 and 180 Torr. Examples, of other oxidizing gases include sulfur hexafluoride, chlorine, and the like. Note that the oxidizing gas may be wholly or partially converted to a plasma in the etching chamber. Suitable copper oxide etchants include those mentioned previously such as a dissociated acid. In a preferred process, the copper oxide is removed using dilute sulfuric acid (pH <2).

Returning to FIG. 2, after the metal portions of the substrate are etched to provide newly exposed recessed metal portions of the substrate, a post-etch treatment may optionally be implemented prior to forming the capping layer. See process block 205. When the substrate is exposed to water and air in the ambient after the etch process, the copper surfaces can readily oxidize to form a copper oxide film. Generally, this copper oxide film reduces adhesion of the subsequently deposited capping layer (although, to some extent it has been found that a little bit of copper oxide can aid to the adhesion). Post-etch treatments may be employed to remove at least a portion of the copper oxide to promote better adhesion of the deposited capping layer. Frequently, this is done by a reduction of the copper oxide back to copper metal using an acidic aqueous solution, typically having a pH of about 5 or lower, more preferably about 4 or lower. A dilute sulfuric acid and phosphoric acid have been found to work well. To address the potential problem of copper ions redistributing into the dielectric during the cleaning process, the cleaning solution preferably includes complexing agent such as EDTA.

Returning again to FIG. 2, after the post-etch treatment, if implemented, the next operation forms a conductive capping layer over the etched metal portions of the substrate using electroless deposition 207. In the case of a cobalt capping layer, the deposition process may employ a solution of cobalt ions together with an appropriate reducing agent such as N,N-dimethylamine borane (DMAB) or a source of hypophosphite ion such as ammonium hypophosphite (AHP). As is known in the art, the electroless deposition process can be activated with using a borane or using palladium displacement (e.g., using a $PdCl_2$ activator) for example. The cobalt or other electroless deposited metal may be doped with various dopants or other additives as discussed below.

In one approach, the capping layer is formed using a two-phase method, which involves forming a metal nucleation layer on the etched metal portions of the substrate and forming a bulk metal layer on the metal nucleation layer. The two phases of deposition process take place at different times, although some overlap is possible and even preferable in some embodiments. A few aspects of the two-phase approach will now be summarized.

In the first phase of the preferred two-phase approach, a thin conformal metal layer referred to as a metal nucleation layer is selectively deposited on the exposed metal surfaces but not on dielectric regions of the substrate. The metal nucleation layer provides a "seed" for the subsequently deposited bulk metal layer to be deposited on. Generally, the nucleation electroless bath is an aqueous solution including a source of metal ions and a reducing agent. In preferred embodiments in which a cobalt capping layer is deposited, the nucleation electroless bath contains a cobalt ion source and preferably a borane compound reducing agent. The bath may also include one or more other components such as a stabilizer (a catalytic poison to maintain the thermodynamically unstable bath), a complexing agent (prevents too much free metal ion), a buffer (to keep pH range narrow), a pH adjustor, and/or one or more surfactants. Typically, the thickness of the nucleation layer (seed) is less than about 50 angstroms, and preferably between about 5 and 10 angstroms. The process can be monitored using a reference electrode that indicates when a complete layer of cobalt has been deposited.

In the second phase of the two-phase approach, a bulk metal layer is deposited on the nucleation layer. The bulk metal layer acts as the main barrier for preventing copper diffusion and is generally thicker than the nucleation layer. The bulk deposition process is preferably autocatalytic; i.e., the kinetics should favor metal deposition on a solid capping layer metal surface. In addition, the process should employ relatively inexpensive reactants such as hypophophite (e.g. ammonium hypophosphite) as a reducing agent. Further, the process should proceed rapidly and produce a high quality barrier film. As with the metal nucleation layer deposition, the bulk metal electroless plating bath will generally include a source of metal ions and a reducing agent provided in an aqueous solution.

In preferred embodiments, the capping layer comprises a refractory metal such as cobalt, although any conductive material can be used. The capping layer may also contain other materials that may be impurities or purposefully added components such as tungsten, boron, phosphorus, titanium, tantalum, zinc, cadmium, molybdenum and/or lead. These additional materials may form an alloy with the metal. Or they may serve as dopants in the metal. Or they may form a non-equilibrium mixture with the metal. Preferably, the additional materials fill or "stuff" the metal grain boundaries with amorphous material and thereby block natural diffusion paths. This of course improves the barrier properties of the metal capping layer. The metal (with or without such additional material) may exist in various morphologies such as amorphous or polycrystalline morphologies. Generally, metal layers with greater amorphous character serve as more effective diffusion barriers.

The capping layer is deposited such that it is thick enough to act as a diffusion barrier but not too thick as to create too much resistance between conductive metal layers. To some extent, a suitable thickness of the capping layer is dependent upon the morphology of the underlying metal layer. That is, if the underlying etched metal has considerable grain structures a thicker capping layer may be necessary compared to if the underlying metal layer grain size is small or amorphous. A preferable capping layer thickness typically ranges between about 30 and 500 Angstroms, more preferably between about 100 and 200 Angstroms.

Returning to FIG. 2, after the conductive capping layer is deposited, next an optional post-plating treatment is performed 209. The post-deposition process may be an anneal process, for example, in which the dopants from the nucleation layer and the bulk layer are permitted to intermix. For example, in the case of some embodiments where a cobalt capping layer is deposited, boron from the cobalt nucleation layer and phosphorus from the bulk cobalt layer can mix to form a $CoB_xP_y$ barrier capping layer. The degree of the boron/phosphorus mixing and the distribution of the boron and phosphorus in the final $CoB_xP_y$ capping layer will depend upon anneal process conditions (e.g., temperature and anneal time). In addition, the microstructure of the resulting mixed $CoB_xP_y$ capping layer can be controlled by the anneal process. Preferred substrate temperatures of anneal processes are between about 150 and 400 degrees Celsius. The anneal time may range between about 30 seconds (high temperature) and one hour (low temperature, typically in a batch mode), with longer times being required for lower temperatures, and is typically performed under vacuum.

After the post clean/anneal process, the next process operation is an optional nitridation of the metal capping layer (see FIG. 2, block 211). In certain cases, it may be desirable to further enhance the barrier properties of the metal capping layer. In these cases, this optional nitridation process can be performed. In cases where a cobalt capping layer is used, nitridation produces a cobalt nitride layer that has good barrier properties. The cobalt nitride layer may include $BN_X$ and/or $PN_X$ and/or $WN_X$, depending on the reducing agents/dopants used in the previous electroless deposition steps, and preferably has an amorphous microstructure. For a detailed description of this nitridation process, see U.S. application Ser. No. 10/317,373, which is fully incorporated by reference herein.

Experimental Data

Figure 3:
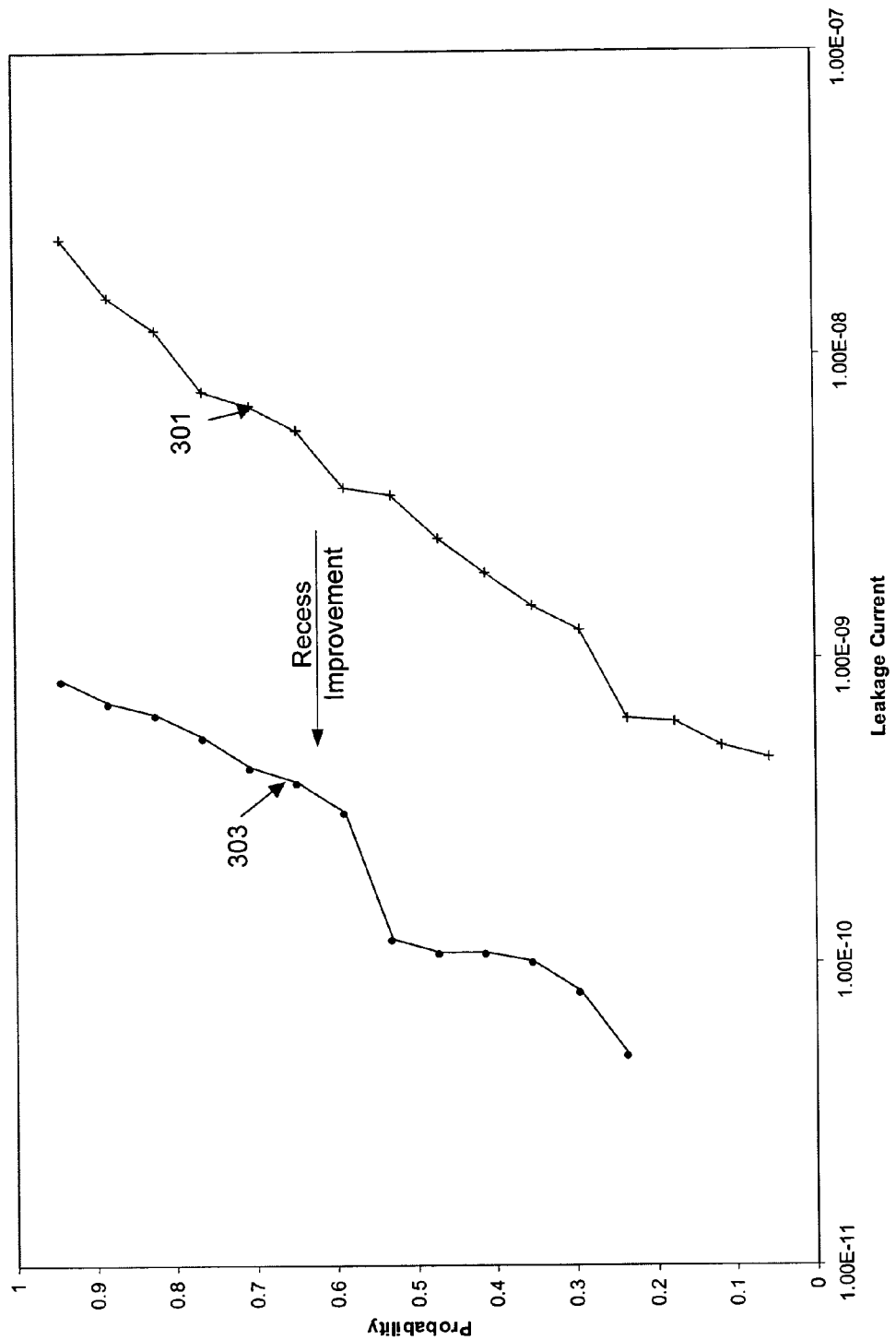
FIG. 3 is a graph comparing current leakage data of an integrated device using traditional capping layer formation methods and an integrated device using capping layer formation methods of the present invention.

FIG. 3 is a graph showing the data of the leakage currents from two different integrated circuit devices. Line 301 shows data from a wafer that was fabricated using conventional cobalt capping layer methods and line 303 shows data from a wafer that was fabricated by recessing the copper lines before depositing a cobalt capping layer in accordance with the present invention. The individual points within the lines 301 and 303 represent an individual die within the wafers that is tested for leakage current. The X axis of the graphs represents the leakage current for the device at 40 volts and the Y axis represents the cumulative probability of all the dies that are tested across the wafer. Both wafers are fabricated using the same mask pattern. As shown by the shift in the X direction of graph, the wafer fabricated using the capping layer methods of the present invention (line 303) shows reduced device leakage current compared to the wafer fabricated using conventional methods (line 301).

What is claimed is:

1. A method of depositing a metal-containing capping layer on metal portions of a substrate containing a layer of metal and dielectric, the method comprising:
   (a) receiving the substrate containing the layer of metal and dielectric;

(b) wet etching metal from the substrate from a position above or coplanar with an upper level of dielectric to a position below the upper level of exposed dielectric in the layer by contacting the substrate with a wet etching solution, wherein the etching solution oxidizes the metal of the substrate to a metal oxide, further comprising removing the metal oxide so that the exposed metal portions attain said position below the upper level of the exposed dielectric, wherein oxidizing the metal of the substrate to a metal oxide and removing the metal oxide takes place in one etching solution; and (c) forming the capping layer on at least exposed metal portions of the substrate by electroless deposition.

2. The method of claim 1, wherein the metal of the layer is copper or a copper alloy.

3. The method of claim 1, wherein the capping layer comprises a refractory metal.

4. The method of claim 1, wherein the capping layer comprises cobalt.

5. The method of claim 1, wherein the metal of the layer is etched to a position below the level of the exposed dielectric that is approximately equal to or lower than a target thickness of the capping layer.

6. The method of claim 1, wherein the capping layer is between about 30 and 500 Angstroms thick.

7. The method of claim 1, wherein the etching solution comprises an oxidizing agent selected from the group consisting of a peroxide, a permanganate, ozone, and a persulfate.

8. The method of claim 1, wherein the etching solution further comprises a corrosion inhibitor.

9. The method of claim 1, wherein the etching solution further comprises a surfactant.

10. The method of claim 1, wherein contacting the substrate with an etching solution comprises dipping, spraying or using a thin film reactor.

11. The method of claim 1, further comprising performing a post-deposition anneal of the capping layer.

12. The method of claim 1, further comprising nitriding the capping layer.

13. The method of claim 1, wherein the substrate received in (a) comprises exposed regions of dielectric.

14. The method of claim 1, wherein the substrate received in (a) comprises metal covering the upper level of dielectric.

15. The method of claim 1, wherein removing the metal oxide comprises contacting the substrate with an oxide etchant that selectively removes the metal oxide and not the metal.

16. The method of claim 15, wherein the oxide etchant comprises glycine.

17. The method of claim 15, wherein the oxide etchant comprises a complexing agent for ions of the metal.

18. The method of claim 1, further comprising performing a post-etch treatment of the substrate prior to forming the capping layer.

19. The method of claim 18, wherein the post-etch treatment of the substrate involves cleaning the etched metal portions of the substrate prior to forming the capping layer.

20. A method of depositing a metal-containing capping layer on metal portions of a substrate containing a layer of metal and dielectric, the method comprising:

(a) receiving the substrate containing the layer of metal and dielectric;

(b) etching metal from the substrate from a position above or coplanar with an upper level of dielectric to a position below the upper level of exposed dielectric in the layer by contacting the substrate with an oxidizing gas that oxidizes the exposed metal to a metal oxide and further contacting the substrate with a metal oxide etching agent to remove the metal oxide; and (c) forming the capping layer on at least exposed metal portions of the substrate by electroless deposition.

21. The method of claim 20, wherein the oxidizing gas comprises oxygen.

22. The method of claim 21, wherein the oxidation occurs at a temperature between about 200 and 300 degrees Celsius and at a pressure between about 50 and 180 Torr of oxygen.

23. A method of etching metal portions of a substrate containing a layer of metal and dielectric, the method comprising:

receiving the substrate containing the layer of metal and dielectric; and etching metal from the substrate to a position below an upper level of exposed dielectric by contacting the substrate with a wet etching solution comprising between about 0.05% and 15% glycine by weight and between about 0.5% and 20% peroxide by weight, at a pH in a range of between about 5 and 12, wherein the etching is accomplished by contacting at least the metal with an etching solution, wherein the contacting comprises at least one of immersing, spraying, dipping, spin on contact, and using a thin film reactor.

24. The method of claim 23, wherein the peroxide is $H_2O_2$.

25. The method of claim 23, wherein the etching solution has a pH in a range of between about 6 and 10.

26. The method of claim 23, wherein the etching solution comprises about 1% by weight glycine and about 3% by weight $H_2O_2$.

27. The method of claim 23, further comprising forming a capping layer on the etched metal portions of the substrate.

28. A method of etching metal portions of a substrate containing a layer of metal and dielectric, the method comprising:

receiving the substrate containing the layer of metal and dielectric, wherein substrate comprises overburden covering dielectric field regions; and etching metal from the substrate to expose the dielectric field regions by contacting the substrate with a wet etching solution comprising between about 0.05% and 15% glycine by weight and between about 0.5% and 20% peroxide by weight, at a pH in a range of between about 5 and 12, wherein the etching is accomplished by contacting at least the metal with an etching solution, wherein the contacting comprises at least one of immersing, spraying, dipping, spin on contact, and using a thin film reactor.

29. The method of claim 28, wherein the peroxide is $H_2O_2$.

30. The method of claim 28, wherein the etching solution has a pH in a range of between about 6 and 10.

31. The method of claim 28, wherein the etching solution comprises about 1% by weight glycine and about 3% by weight $H_2O_2$.

32. The method of claim 28, comprising forming a capping layer on the etched metal portions of the substrate.

33. The method of claim 28, wherein the metal is copper.

34. The method of claim 28, further comprising, prior to the etching, planarizing the substrate surface.

35. The method of claim 34, wherein the planarization is chemical mechanical polishing.

36. The method of claim 34, wherein the planarization is an electroplanarization technique.

37. A method of etching metal portions of a substrate containing a layer of metal and dielectric, the method comprising:
  receiving the substrate containing the layer of metal and dielectric, wherein the substrate comprises overburden covering dielectric field regions;
  at least partially completing planarization of the overburden; and
  etching to remove the remaining overburden on the substrate by contacting the substrate with a wet etching solution at a pH in a range of between about 5 and 12 and comprising between about 0.05% and 15% glycine by weight and between about 0.5% and 20% peroxide by weight, wherein the etching is accomplished by contacting at least the metal with an etching solution, wherein the contacting comprises at least one of immersing, spraying, dipping, spin on contact, and using a thin film reactor.

38. The method of claim 37, wherein etching solution further comprises a surfactant.

39. The method of claim 37, wherein the etching solution further comprises a corrosion inhibitor.

40. The method of claim 37, wherein the peroxide is hydrogen peroxide.

41. The method of claim 37, wherein the etching solution has a pH in a range of between about 6 and 10.

42. The method of claim 37, further comprising forming a capping layer on the etched metal portions of the substrate.

43. The method of claim 37, wherein the metal is copper.

44. The method of claim 37, wherein the planarization is chemical mechanical polishing.

45. The method of claim 37, wherein the planarization is an electroplanarization technique.

46. A method of etching metal portions of a substrate containing a layer of metal and dielectric, the method comprising:
  receiving the substrate containing the layer of metal and dielectric, wherein substrate comprises overburden covering dielectric field regions; and
  etching to remove at least a portion of the overburden on the substrate by contacting the substrate with a wet etching solution at a pH in a range of between about 5 and 12 and comprising between about 0.05% and 15% glycine by weight and between about 0.5% and 20% peroxide by weight, wherein the etching is accomplished by contacting at least the metal with an etching solution, wherein the contacting comprises at least one of immersing, spraying, dipping, spin on contact, and using a thin film reactor.

47. The method of claim 46, further comprising at least partially completing removing the overburden via chemical mechanical processing.

48. The method of claim 46, further comprising forming a capping layer on the etched metal portions of the substrate.

49. The method of claim 46, wherein the metal is copper.

50. The method of claim 46, wherein etching solution further comprises a surfactant.

51. The method of claim 46, wherein the etching solution further comprises a corrosion inhibitor.

52. The method of claim 46, wherein the etching solution has a pH in a range of between about 6 and 10.

53. The method of claim 46, wherein the etching solution comprises about 1% by weight glycine and about 3% by weight $H_2O_2$.

54. A method of depositing a metal-containing capping layer on metal portions of a substrate containing a layer of metal and dielectric, the method comprising:
  (a) receiving the substrate containing the layer of metal and dielectric;
  (b) wet etching metal from the substrate from a position above or copolymer with an upper level of dielectric to a position below the upper level of exposed dielectric in the layer by contacting the substrate with a wet etching solution, wherein the etching solution oxidizes the metal of the substrate to a metal oxide, further comprising removing the metal oxide so that the exposed metal portions attain said position below the upper level of the exposed dielectric, wherein removing the metal oxide comprises contacting the substrate with an oxide etchant that selectively removes the metal oxide and not the metal, said oxide etchant comprising glycine; and
  (c) forming the capping layer on at least exposed metal portions of the substrate by electroless deposition.

* * * * *

UNITED STATES PATENT AND TRADEMARK OFFICE
CERTIFICATE OF CORRECTION

| | | |
|---|---|---|
| PATENT NO. | : 7,338,908 B1 | Page 1 of 1 |
| APPLICATION NO. | : 10/690084 | |
| DATED | : March 4, 2008 | |
| INVENTOR(S) | : Koos et al. | |

It is certified that error appears in the above-identified patent and that said Letters Patent is hereby corrected as shown below:

In line 7 of claim 54 (column 16, line 28) change "copolymer" to --coplanar--.

Signed and Sealed this

Sixteenth Day of September, 2008

JON W. DUDAS
*Director of the United States Patent and Trademark Office*